United States Patent
Koehler

(10) Patent No.: US 10,261,149 B2
(45) Date of Patent: Apr. 16, 2019

(54) METHOD AND APPARATUS FOR DETERMINING A B1 FIELD MAP IN A MAGNETIC RESONANCE SCANNER

(71) Applicant: Siemens Healthcare GmbH, Erlangen (DE)

(72) Inventor: Michael Koehler, Nuremberg (DE)

(73) Assignee: Siemens Healthcare GmbH, Erlangen (DE)

(*) Notice: Subject to any disclaimer, the term of this patent is extended or adjusted under 35 U.S.C. 154(b) by 182 days.

(21) Appl. No.: 15/435,518

(22) Filed: Feb. 17, 2017

(65) Prior Publication Data

US 2017/0242085 A1 Aug. 24, 2017

(30) Foreign Application Priority Data

Feb. 19, 2016 (DE) .................. 10 2016 202 617

(51) Int. Cl.
| | | |
|---|---|---|
| *G01R 33/44* | (2006.01) | |
| *G01R 33/565* | (2006.01) | |
| *G01R 33/58* | (2006.01) | |
| *G01R 33/24* | (2006.01) | |

(52) U.S. Cl.
CPC ......... *G01R 33/443* (2013.01); *G01R 33/246* (2013.01); *G01R 33/5659* (2013.01); *G01R 33/586* (2013.01)

(58) Field of Classification Search
CPC .......... G01R 33/443; G01R 33/5659; G01R 33/586; G01R 33/246
See application file for complete search history.

(56) References Cited

U.S. PATENT DOCUMENTS

| | | | | |
|---|---|---|---|---|
| 7,038,453 B2* | 5/2006 | Feiweier | ............... | G01R 33/583 324/309 |
| 8,781,197 B2* | 7/2014 | Wang | ..................... | G01R 33/54 382/131 |
| 8,890,527 B1 | 11/2014 | Balcom et al. | | |
| 2005/0073304 A1* | 4/2005 | Feiweier | ............... | G01R 33/583 324/307 |
| 2011/0044524 A1* | 2/2011 | Wang | ..................... | G01R 33/54 382/131 |

(Continued)

OTHER PUBLICATIONS

Schär, et al., "Simultaneous B0+ and B1+-Map Acquisition for Fast Localized Shim, Frequency, and RF Power Determination in the Heart at 3 T," Magnetic Resonance in Medicine, vol. 63, No. 2, pp. 419-426 (2010).

(Continued)

*Primary Examiner* — Dixomara Vargas
(74) *Attorney, Agent, or Firm* — Schiff Hardin LLP

(57) ABSTRACT

In a method and magnetic resonance apparatus for determining a B1 field map in a scanner of the apparatus, the B1 field map describing a local field distribution of a B1 field resulting from excitation pulses radiated in a measurement sequence, first and second measured values are acquired from a region in which nuclear spins are excited by an excitation pulse having an assigned flip angle, and a provisional flip angle is determined from the first and second measured values. A correction factor, dependent on the pulse shape of a selected excitation pulse, is then determined, and the provisional flip angle is multiplied thereby to obtain a corrected value for entry into said B1 field map.

11 Claims, 4 Drawing Sheets

(56) References Cited

U.S. PATENT DOCUMENTS

2014/0070805 A1\* 3/2014 Van Der Meulen .......................... G01R 33/246
324/309

OTHER PUBLICATIONS

Wang, et al., "Factors Influencing Flip Angle Mapping in MRI: RF Pulse Shape, Slice-Select Gradients, Off-Resonance Excitation, and B0 Inhomogeneities," Magnetic Resonance in Medicine, vol. 56, pp. 463-468 (2006).
Cunningham, et al., "Saturated Double-Angle Method for Rapid B1+ Mapping," Magnetic Resonance in Medicine, vol. 55, pp. 1326-1333 (2006).
Nehrke et al., "DREAM—A Novel Approach for Robust, Ultrafast, Multislice $B_1$ Mapping," Magnetic Resonance in Medicine, vol. 68, pp. 1517-1526 (2012).
Cheng et al., "Rapid High-Resolution $T_1$ Mapping by Variable Flip Angles: Accurate and Precise Measurements in the Presence of Radiofrequency Field Inhomogeneity," Magnetic Resonance in Medicine, vol. 55, pp. 566-574 (2006).
Katscher et al., "Transmit SENSE," Magnetic Resonance in Medicine, vol. 49, pp. 144-150 (2003).

\* cited by examiner

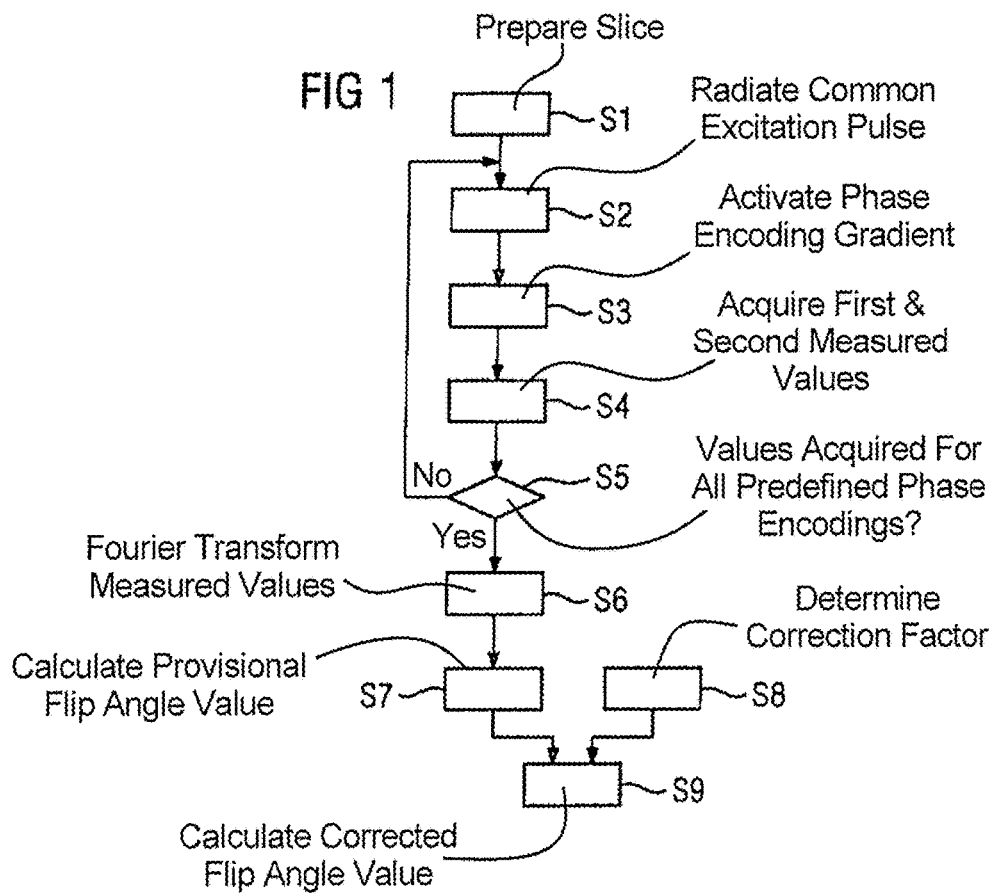
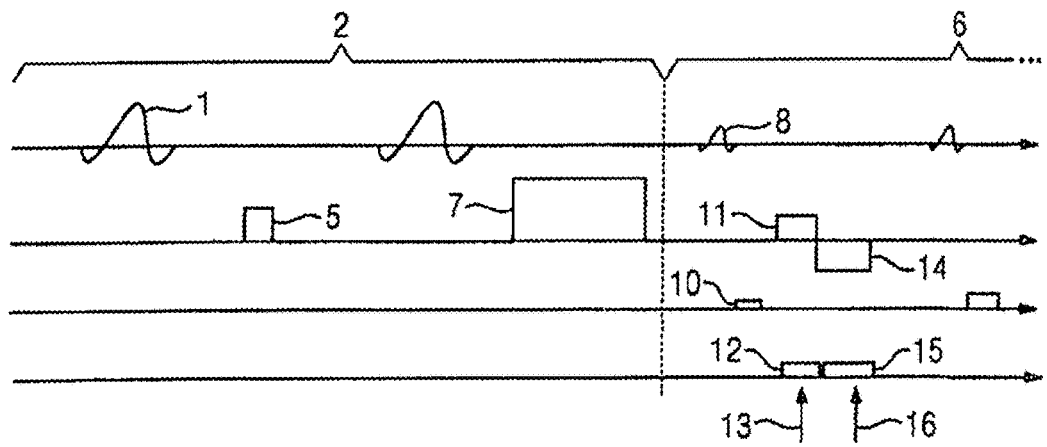

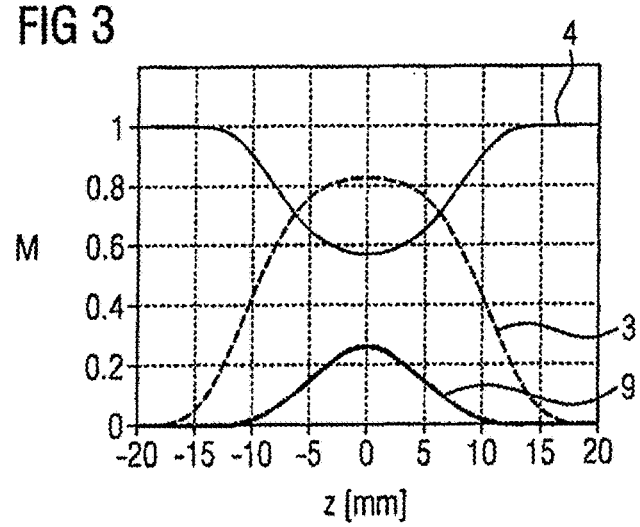
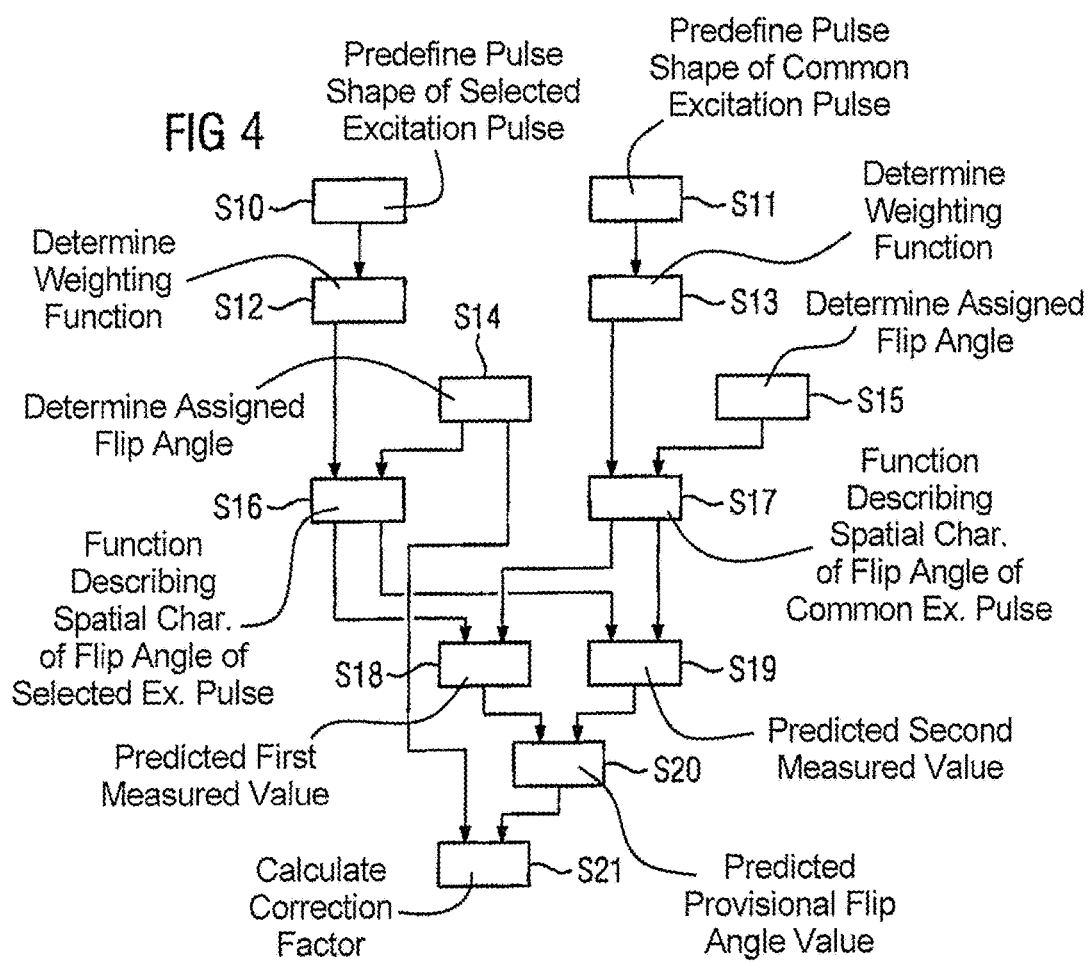

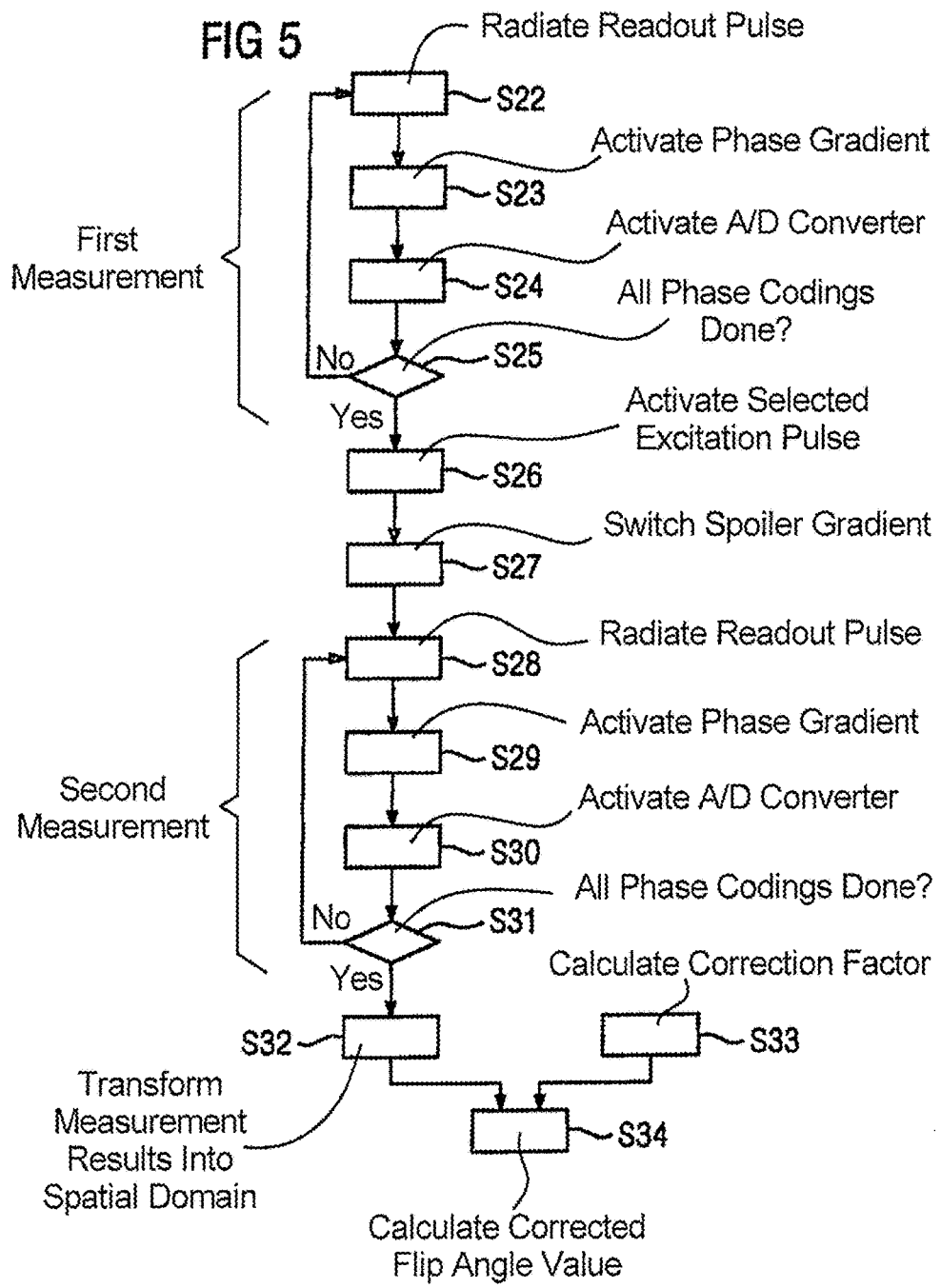

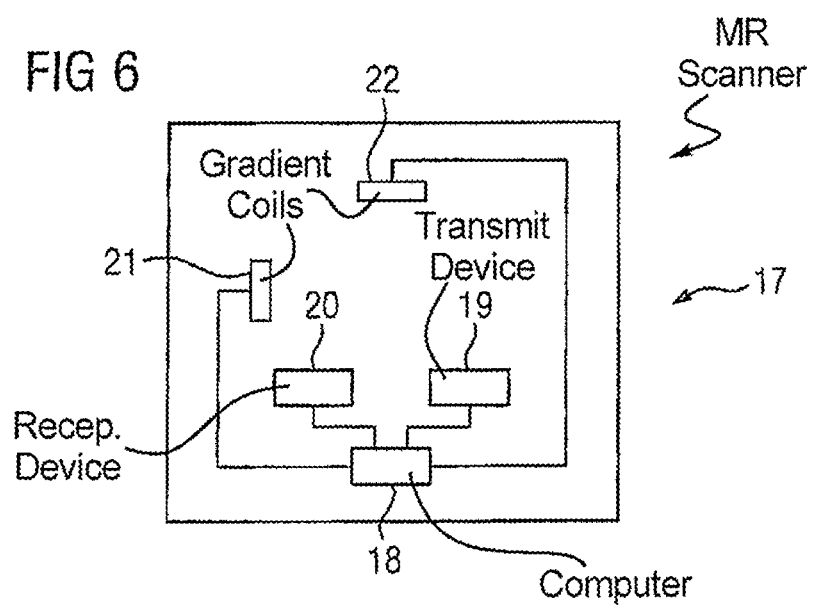

METHOD AND APPARATUS FOR DETERMINING A B1 FIELD MAP IN A MAGNETIC RESONANCE SCANNER

BACKGROUND OF THE INVENTION

Field of the Invention

The invention concerns to a method for determining a B1 field map in a magnetic resonance tomography scanner, the map describing the local field strength of a radiofrequency electromagnetic alternating B1 field radiated by a transmit antenna to excite nuclear spins in at least one measurement region of a subject, wherein, as part of a measurement sequence, the transmit antenna radiates multiple excitation pulses that change the magnetization of an excitation region encompassing the measurement region according to an assigned flip angle, and a first measured value is acquired in a first measuring interval and a second measured value is acquired in a second measuring interval by a reception antenna, the measured values relating to the magnetization in the measurement region, wherein a provisional flip angle value for the flip angle assigned to a selected excitation pulse in the measurement region is determined as a function of the first and second measured values. The invention also concerns a magnetic resonance tomography scanner for implementing such a method.

Description of the Prior Art

The field strength of the RF field used in magnetic resonance tomography scanners to excite slices of an object under examination, the so-called B1 field, is usually not homogeneous throughout the measurement region. Inhomogeneities may be caused by the system geometry of the magnetic resonance tomography scanner and by the object under examination itself. By taking this inhomogeneity into account during data analysis, the measurement quality of many measuring methods, e.g. of T1 imaging techniques, can be significantly improved. B1 inhomogeneity acquisition can also be used for calibration or fault diagnostics in magnetic resonance tomography scanners or for pulse calculation in multichannel operation. It is therefore known to measure B1 field maps that describe a local strength of the B1 field in different measurement regions, particularly in the form of a two-dimensional pixel or three-dimensional voxel field.

The local B1 field strength can be acquired by radiating an excitation pulse having a predefined flip angle, and measuring the flip angle achieved locally by that excitation pulse. The problem here is that when individual slices are excited, the flip angle actually achieved varies across the slice thickness even if the B1 field is completely homogeneous. In the case of magnetic resonance tomography scanners, slice selection is performed by choosing an appropriate excitation pulse which, because of its frequency spectrum and a slice selection gradient, excites the object under examination in a slice-specific manner. However, for homogeneous excitation of a defined slice, the excitation pulse would have to represent a Fourier transform of a square wave function in the frequency domain, i.e. a sinc function. However, a sinc excitation pulse would be of infinite length. Sinc pulses that are time-limited by multiplying them by a so-called window function can be used as actual excitation pulses. However, depending on the specifically selected window function, this results in amplitude ripple in the frequency domain and/or in amplitude drop-off toward higher and lower frequencies, i.e. to a "rounding" of the square wave function in the frequency domain. Accordingly, the flip angle achieved varies locally in the case of excitation using such an excitation pulse, wherein it oscillates in the direction of the slice selection gradient and/or decreases from the center of an excitation slice outward to the edges. However, in the case of a magnetic resonance tomography scanner, the magnetization is always acquired as an averaging over an excited slice. A measured flip angle therefore differs from a flip angle in the center of the excitation region which is usually to be determined, wherein the error depends on the pulse shape used.

To avoid this problem, a number of approaches are known in the prior art. It is possible to use preparation pulses, for which a flip angle is to be determined, that are not slice-selective or that have a large slice width compared to the other measurement pulses used in the sequence. However, in this case it is not possible to measure multiple adjacent slices in rapid succession, as these would be affected by preceding non-slice-selective excitations.

More homogeneous excitation for the same slice width can be achieved if preparation pulses having a high bandwidth time product are used. However, corresponding pulse shapes result in large RF pulse amplitudes. If large flip angles are to be simultaneously achieved, the bandwidth time product may be technically limited.

The described inhomogeneities can be prevented from affecting the flip angles acquired if phase-based methods are used for determining flip angles. However, these methods are prone to interference from inhomogeneities in the main magnetic field, may have long measurement times and/or limited dynamic ranges and can result in high SAR loads. It is therefore desirable to use amplitude-based methods for determining flip angles and therefore B1 maps.

SUMMARY OF THE INVENTION

An object of the invention is to provide a method for determining a B1 field map, which provides improved amplitude-based measurement of the B1 field map.

This object is achieved according to the invention by a method of the type described in the introduction, wherein a correction factor dependent on the pulse shape of the selected excitation pulse is determined, and a corrected flip angle value is determined by multiplying the provisional flip angle value by the correction factor, and the corrected flip angle value or a value derived therefrom for describing the local field strength in the measurement region is stored in the B1 field map.

In accordance with the invention, the known pulse shape of the excitation pulse is taken into account for determining a corrected flip angle value as part of determining a B1 field map. Although only the pulse shape of the selected excitation pulse may be taken into account here, the pulse shapes of more of the excitation pulses, in particular of all the excitation pulses affecting the first and/or the second measured value are preferably taken into account. The correction factor can depend on the pulse shape of all the excitation pulses taken into account. In the magnetic resonance tomography scanner, excitation pulses are usually calculated in a discrete-time manner or "synthesized" and output following digital-to-analog conversion. In addition, frequency conversion can optionally take place. The pulse shape is therefore known and the same excitation pulse can be reproducibly emitted. On the basis of this known pulse shape, the extent to which a measured value for the flip angle, i.e. the provisional flip angle value, is at variance with a flip angle in the center of the excitation region can be determined by reference measurements or by calculations. The flip angle in the center of the excitation region can be determined as the corrected flip angle value. This means that an inhomogeneous excitation in the measurement region can be eliminated on the basis of the pulse shape of the selected excitation pulse and remaining inhomogeneities in the corrected flip angle value are attributable to the inhomogeneities to be measured in the B1 field.

The first and second measured value can be an amplitude of an alternating magnetic field emitted by the scanned object excited. A corresponding amplitude correlates to the transverse magnetization in the measurement region, said magnetization precessing in the constant B0 field of the magnetic resonance tomography scanner. In order to allow spatially resolved acquisition, frequency encoding and/or phase encoding can be used. Both procedures are known in the prior art and will only be explained insofar as they are relevant to the method according to the invention. In the case of frequency encoding, the amplitude of an alternating field received by the object under examination is not taken into account in its entirety, but rather the amplitudes of the alternating field are taken into account in different frequency ranges for different slices in the direction of a readout gradient. In the case of phase encoding, an additional gradient which varies the phases of the precessing transverse magnetization in a spatially dependent manner is briefly switched. This results in a spatially dependent mutual amplification or attenuation of the alternating fields emitted from different regions of the object under examination because of the predefined phase shift. The first and the second measured value in this case do not therefore describe a local transverse magnetization, but amplitudes for particular spatial frequencies of the transverse magnetization in the direction of a phase encoding gradient. By acquiring the first and second measured values for a plurality of phase encodings, first and second local magnetization variables describing a spatially resolved transverse magnetization can be determined by Fourier transformation of the spatial frequencies to the spatial domain. In the case of phase encoding, the provisional flip angle value for a particular measurement region is therefore determined from a number of first and second measured values, wherein a first measured value and a second measured value are acquired for each phase encoding.

The provisional flip angle value can be calculated as a function of a quotient of the first and second measured values or as a function of a quotient of a value derived from the first measured value and a value derived from the second measured value. The derived values can be the first and second local magnetization variables. If the provisional flip angle value is determined as a function of a quotient of the measured values, proportionality factors on which the two measured values depend cancel out. This can facilitate calculation of a correction factor and reduce errors in transferring a correction factor determined by measurement. Alternatively, it is possible to determine the provisional flip angle value as a function of a difference between the measured values or between the values derived from the measured values.

The first and second measured values can be acquired after or partly before and partly after radiation of the selected excitation pulse. The B1 field map or rather the flip angle values can be acquired in a spatially resolved manner, preferably for a number of slices or in matrix form in two or three dimensions.

Other excitation or readout pulses can be used in addition to the selected excitation pulse, in particular one for each phase encoding step. In addition, gradients can be switched at different times in the measurement sequence, particularly in order to perform slice selection or phase encoding, to generate gradient echoes or to use so-called spoiler gradients, which completely dephase any transverse magnetization that is present.

The first and the second measured values can be acquired in a time sequential manner without intervening excitation pulses, or can be separated from one another by at least one excitation pulse.

A predicted value for the provisional flip angle value can be determined as a function of a product of the flip angle assigned to the selected excitation pulse and a weighting function predefined according to the pulse shape of the selected excitation pulse, wherein the correction factor is calculated as the quotient of the assigned flip angle of the selected excitation pulse and the predicted value. The weighting function can describe the variation of the excitation strength, i.e. of the flip angle, in the direction of the slice selection gradient. As explained in the introduction, this variation is dependent on the pulse shape of the selected excitation pulse.

The predicted value can be calculated as a function of an integral over an integration range that encompasses the measurement region, wherein the transverse magnetization depending on the flip angle is integrated, optionally taking a precession phase into account. The spatial dependence of all the excitation pulses prior to the respective measuring interval which affect the local flip angle in the measurement region is preferably taken into account, i.e. the assigned flip angle of each of the excitation pulses is weighted with a pulse-shape-dependent weighting function.

The first and the second measured values depend on the local transverse magnetization, or more specifically on the spatial frequencies of the transverse magnetization at the respective measuring times. The transverse magnetization can be calculated from the flip angles of the preceding excitation pulses, taking switched gradient fields into account. The transverse magnetization or rather the measured values may additionally depend on proportionality factors which are dependent, for example, on the characteristics of the object under examination or on inhomogeneities in the B1 field. However, these proportionality factors generally cancel out in the course of calculating the correction factors. If this is not the case, estimated values or factors from previous measurements can be used for any remaining proportionality factors.

The dependence of the actually achieved local flip angles on the pulse shape can be taken into account at least for the selected excitation pulse, preferably for all the excitation pulses, by the weighting function. A calculation of the likely measured values can be performed, wherein spatially dependent flip angles for at least the selected excitation pulse are taken into account. Thus a locally different transverse magnetization can be calculated. As part of predicting the first and second measured value, said transverse local magnetization can be integrated in the direction of the slice selection gradient or summed in the case of a discrete calculation.

The correction factor can be calculated for a plurality of different assigned flip angles of the selected excitation pulse. In this case it is possible to select the correction factor used from the number of calculated correction factors to calculate the corrected flip angle value as a function of the first and/or second measured value, in particular as a function of the provisional flip angle value.

The weighting function can be determined by Fourier transformation of the pulse shape and/or by discrete-time simulation of the excitation of the nuclear spins by the selected excitation pulse. Fourier transformation of the pulse shape corresponds to the representation of the excitation pulse in the frequency domain. As the resonant frequency of the nuclear spins is spatially dependent because of the slice selection gradient, this also corresponds to a location of the excitation, assuming that only a resonant excitation of the nuclear spins takes place. Fourier transformation allows a simple and less computer-intensive determination of the weighting function with typically sufficient accuracy.

By discrete-time simulation of the excitation, e.g. by solving Bloch equations with discrete-time excitation field, it can be taken into account that nuclear spins may also be excited by an excitation frequency adjacent to the resonant frequency. In particular, a corresponding simulation can take place using a time resolution corresponding to the time resolution of the excitation pulses stored or calculated on a discrete-time basis. However, spuriously resonant excitations can also be taken into account by spreading out the particular Fourier spectrum as explained above, e.g. by convolution with a Gaussian function or filtering.

As an alternative to the above explained calculation of a correction factor, it is possible to determine the latter by supplementary measurements. Thus the assigned flip angle may be known for at least one excitation pulse, wherein in a prepared measurement the reference flip angle produced by this excitation pulse in a measurement region is ascertained, after which the correction factor is determined as the quotient of the reference flip angle and the assigned flip angle. This procedure is based on the insight that, after a preceding calibration of the magnetic resonance tomography scanner, the assigned flip angle is identical to the set flip angle in the center of the excitation field assuming a homogeneous B1 field. The measured reference flip angle corresponds to an averaging of the flip angle over the measurement region, wherein the flip angle reduces as the distance from the center of the excited slice increases. Based on the preparatory measurement, a relationship between the flip angle produced in the center of a measurement region and a flip angle averaged over the measurement region is determined and used as the correction factor. Such reference measurements are preferably carried out on a phantom which can be homogeneous and non-conducting and/or can have minimal effect on a B1 field distribution.

The correction factor can also be determined by using different methods with different dependence of a particular flip angle value on the pulse shape. Thus a first and a second calibrating flip angle can be determined by mutually different first and second measuring methods, wherein the first calibrating flip angle depends on a pulse shape of at least one excitation pulse used in the first method and the second calibrating flip angle is independent of the pulse shapes of the excitation pulses used in the second measuring method, wherein the correction factor is determined as a function of the first and the second calibrating flip angle value. The second calibrating flip angle value is essentially independent of the pulse shapes of the excitation pulses, i.e. the effect of the pulse shape on the second calibrating flip angle value is at least one, preferably at least two, orders of magnitude smaller than the effect of the pulse shape on the first calibrating flip angle value.

To make the second calibrating flip angle values largely independent of the pulse shape, block excitation can be used. Here an excitation slice which is significantly wider than a slice excited as part of measured value acquisition for flip angle determination is excited by the excitation pulse whose flip angle is to be determined. Phase-based methods for determining flip angles can also be used to determine the second calibrating flip angle, as these are largely independent of pulse shape as explained in the introduction.

The correction factor can be determined as a function of the provisional flip angle value. In particular, a plurality of correction factors which are assigned to excitation pulses having the same pulse shape and having different assigned flip angles can be calculated and/or determined by additional measurements. The assigned flip angles can be determined by the amplitude of the respective excitation pulse. Depending on the provisional flip angle values determined, one of these correction factors can be selected or interpolation between a plurality of these correction factors can take place. This procedure may be advantageous if a slice profile, i.e. the spatial distribution of the excitation by an excitation pulse, can change with an amplitude of the excitation pulse, i.e. with the thereto assigned flip angle.

The selected excitation pulse can be radiated twice in the measurement sequence prior to acquisition of the first and second measured values, with the assigned flip angle of the selected excitation pulse being less than 90°, and a first gradient field is activated between the radiations to dephase the transverse magnetization. A common excitation pulse is used to acquire the first and second measured values, and a second gradient field is activated in and/or prior to the first measuring interval or the second measuring interval so as to produce an echo of the previously dephased magnetization.

The common excitation pulse acts here as a readout pulse, i.e. it rotates an available to-be-measured longitudinal magnetization in the transverse direction. A longitudinal magnetization corresponds to a magnetization parallel to the main magnetic field B0 of the magnetic resonance tomography scanner. The phase of the precession of the transverse magnetization is here dependent on the preceding preparation, i.e. on the excitation by the two selected excitation pulses and the dephasing by the first gradient field. The first radiation of the selected excitation pulse causes part of the longitudinal magnetization that is present to be flipped into the transverse plane, where it is dephased by the first gradient field. The second radiation of the selected excitation pulse causes parts of this dephased transverse magnetization to be flipped in the longitudinal direction. Optionally, any remaining transverse magnetization can be completely dephased by activating a spoiler gradient so that it has no further effect on subsequent measurements.

The common excitation pulse causes part of the longitudinal magnetization to be flipped into the transverse plane. The part of the magnetization that was flipped into the transverse plane by neither of the two selected excitation pulses is here unprepared and not dephased after the common excitation pulse. The part of the magnetization that was flipped into the transverse plane by the first excitation pulse and again in the longitudinal direction of the B0 field by the second excitation pulse has, after conversion into a transverse magnetization by the common excitation pulse, a spatially dependent distribution which is predefined by the dephasing by the first gradient field.

The time-spaced measurement of the first and second measured values in the first and second measuring intervals and the activation of at least the second gradient field enables the part of the magnetization dephased by the first gradient field and the part of the magnetization not dephased by the first gradient field to be measured separately from one another. The dephased and subsequently rephased magnetization is also termed the stimulated echo. The undephased magnetization can also be measured as so-called "free induction decay". Here it may be advantageous to measure the undephased magnetization in the form of a gradient echo by appropriate switching of gradient fields after the second playout of the selected excitation pulse, i.e. to initially dephase by a gradient field and then generate a gradient echo by means of a reverse gradient. A corresponding gradient echo for the undephased magnetization can be measured, for example, by activating the second gradient field before and/or during the first measuring interval. This provides an echo of the previously dephased magnetization in the first measuring interval, but simultaneously dephases the previously undephased magnetization. After the first measuring interval and before and/or during the second measuring interval, a third gradient field can now be switched in order to remove this subsequent dephasing and provide a gradient echo. The first measured value is in this case proportional to the part of the magnetization that was flipped into the transverse plane by the first radiation of the excitation pulse and back into the longitudinal direction by the second radiation. The second measured value is proportional to the part of the magnetization that was not flipped out of the longitudinal direction by either of the two radiations of the excitation pulse.

The common excitation pulse can be repeatedly radiated and, after each radiation, both the first and the second measured values can be read out and at least the second gradient field can be activated. In addition, phase encoding can be performed after the respective common excitation pulse. In this case, by virtue of the acquired first and second measured values, spatial frequencies of the corresponding magnetizations are acquired that can be converted by subsequent Fourier transformation into first and second local magnetization variables that describe the respective local magnetization.

The assigned flip angle of the common excitation pulse can be smaller than the assigned flip angle of the selected excitation pulse. The assigned flip angle of the common excitation pulse can be at least a factor of 2 or 4 smaller than the assigned flip angle of the common excitation pulse and can be in particular max. 15°. As a result, effects of excitation inhomogeneities can be minimized by the common excitation pulse. A sub-region not encompassing the entire excitation region of the selected excitation pulse can be excited by the common excitation pulse. The common excitation pulse therefore can have less spectral width than the selected excitation pulse. The first and second measured values are therefore acquired for a sub-region of the slice excited by the selected excitation pulse. Consequently, only the region in which the excitation pulse produces relatively homogeneous excitation is examined.

In an alternative embodiment of the method according to the invention, the first measured value is acquired prior to radiation of the selected excitation pulse and the second measured value after radiation of the selected excitation pulse. For example, a two- or three-dimensional measurement using a particular measurement sequence is first carried out, then the selected excitation pulse is radiated and the resulting transverse magnetization is dephased by a spoiler gradient, whereupon the preceding measurement sequence can be repeated. From the ratio of the first measured values of the first execution of the measurement sequence before playout of the selected excitation pulse to the second measured values of the second execution of the measurement sequence after playout of the selected excitation pulse, a provisional flip angle value for the selected excitation pulse can be determined, which can then be corrected as explained above.

In addition to the inventive method, the invention also concerns a magnetic resonance tomography scanner having a control computer, at least one transmit antenna, and at least one reception antenna, with the control computer being configured to control the transmit antenna, to acquire the first and the second measured values via the reception antenna, and to process the first and second measured values to determine the B1 field map according to the inventive method. For this purpose the control computer is designed to control one or more gradient coils in order to provide slice selection gradients, phase encoding gradients, gradients for dephasing or rephasing transverse magnetizations, and/or spoiler gradients. The reception antenna receives alternating RF electromagnetic fields which are emitted by an object under examination excited by the excitation pulses.

BRIEF DESCRIPTION OF THE DRAWINGS

FIG. 1 is a flowchart of an exemplary embodiment of the method according to the invention.

FIG. 2 shows a measurement sequence used in the exemplary embodiment illustrated in FIG. 1.

FIG. 3 shows a spatial distribution of the longitudinal and transverse magnetization in the object under examination after radiation of the excitation pulses shown in FIG. 2.

FIG. 4 shows a calculation of the correction factor in the exemplary embodiment illustrated in FIG. 1.

FIG. 5 is a flowchart of another exemplary embodiment of the method according to the invention.

FIG. 6 shows an exemplary embodiment of a magnetic resonance tomography scanner according to the invention.

DESCRIPTION OF THE PREFERRED EMBODIMENTS

FIG. 1 shows an exemplary embodiment of a method for determining a B1 field map in a magnetic resonance tomography scanner, the field map describing a local field strength of an alternating RF electromagnetic field radiated by a transmit device to excite nuclear spins for a number of measurement regions disposed in a matrix-like manner. The method will be explained with reference to the measurement sequence schematically illustrated in FIG. 2.

In step S1, a slice of an object under examination is first prepared, as shown in section 2 of the sequence in FIG. 2. Here a slice selection gradient (not shown) is applied and nuclear spins in a slice of an object under examination are excited by the selected excitation pulse 1. The excitation pulse 1 rotates the magnetization in the center of the excited slice through an assigned flip angle $\alpha$. The amplitude of the excitation pulse 1 is selected such that the flip angle $\alpha$ is <90°.

Prior to the radiation of the excitation pulse 1, the magnetization is aligned essentially longitudinally, i.e. it points in the direction of the basic magnetic field B0 of the magnetic resonance tomography scanner. The excitation pulse 1 produces a transverse magnetization of nuclear spins that is proportional to $\sin(\alpha)$. The remaining longitudinal magnetization is proportional to $\cos(\alpha)$. The magnetization profile of the slice after excitation is shown in FIG. 3, wherein curve 3 shows the transverse magnetization and curve 4 the remaining longitudinal magnetization. Were the excitation pulse 1 to be an ideal sinc pulse, curve 3 would have a rectangular shape, i.e. a sharply delimited slice with a constant (uniform) flip angle throughout, and therefore a constant magnetization. If an excitation pulse 1 of finite length is used, this produces either oscillations of the flip angle and therefore of the magnetization over the slice thickness, or a rounding of the rectangular excitation profile, depending on the window function selected. Oscillations are generally to be avoided, for which reason rounded slice profiles are used, as shown in FIG. 3 by curve 3.

The flip angle α assigned to the excitation pulse 1 and the magnetization assigned to that flip angle is achieved only in the center of the slice, at the origin in the X-direction in FIG. 3. However, in magnetic resonance tomography scanners, signals averaged over the entire region that is excited are always acquired. In order to determine a correct flip angle α for the excitation pulse 1, i.e. the flip angle in the center of the excited slice, the rounding of the slice profile as shown in FIG. 3 must therefore be taken into account for data analysis. This will be explained later with reference to steps S8 and S9.

Between the first radiation and the second radiation of the excitation pulse 1, a first gradient field 5 for dephasing the transverse magnetization is activated. Signals emitted by the nuclear spins resulting from the transverse magnetizations are acquired in magnetic resonance tomography scanners by receiving the electromagnetic radiation emitted by the excited object under examination. If a number of regions of the object under examination emit signals in phase, the received intensities are added together. After dephasing, however, the oscillation phases in the individual regions of the object under examination are shifted with respect to one another such that the received radiation intensity is essentially reduced to zero. The second radiation of the excitation pulse 1 causes the dephased transverse magnetization to be partially flipped back in the longitudinal direction. Here a tilting in the direction of the basic magnetic field B0 or counter to the basic field B0 can take place. The longitudinal magnetization that is available after the second excitation pulse 1 therefore splits into two parts, wherein a first part that is proportional to $\cos^2(\alpha)$ has been tilted into the transverse plane and dephased by neither of the two excitation pulses 1, and a second part that is proportional to ½ $\sin^2(\alpha)$ has been dephased and is available for a stimulated echo as part of readout in region 6 of the sequence. Before such a readout takes place, a spoiler gradient 7 is activated, which completely dephases the remaining transverse magnetization so that it is no longer included in the subsequent measurements.

In steps S2 to S5, a number of first and second measured values are acquired. A number of phase encodings are performed in order to allow spatially resolved measurement of the flip angle values. For this purpose, in step S2 a common excitation pulse 8 is radiated, which has a relatively small flip angle β and therefore flips only a small part of the longitudinal magnetization into the transverse plane. The slice profile, i.e. the spatial distribution of the magnetization caused by the excitation pulse 8, is shown as curve 9 in FIG. 3. Also for the excitation pulse 8, the assigned flip angle is only attained in the center of the excited slice. The transverse magnetization is proportional to $\sin(\beta)$ in the slice center. As shown in FIG. 3, a common excitation pulse 8 is used that excites a slice that is less wide than the selected excitation pulse 1. By combining a flip angle β which is smaller by at least a factor of two to four than the flip angle α with a relatively narrow slice profile for the common excitation pulse 8, the effects of the slice profile of the selected excitation pulse 1 on the subsequently determined provisional flip angle value can be reduced, wherein the correction in step S9 to be explained below allows further improvements.

In step S3, a phase encoding gradient 10 is activated, the direction of which is essentially perpendicular to the slice selection gradient. The use of the phase encoding gradient 10 allows phase encoding in one or two dimensions in order to enable spatially resolved determination of the flip angle of the selected excitation pulse 1. The first and the second measured values in this case do not directly describe first and second local magnetization variables that describe a local magnetization of the object under examination, but spatial frequencies of the local magnetization variables. As will be explained below, the first and the second measured values are acquired for a number of phase encodings, after which a Fourier transformation enables first and second local magnetization variables to be determined from which the provisional flip angle value is obtained. The use of phase encodings is well known in the field of magnetic resonance tomography and thus need not be explained in detail herein.

In step S4, the first and the second measured values are acquired. For this purpose, a second gradient field 11 is first activated, which is aligned to the previously switched first gradient field 5. The RF radiation emitted by the object under examination is simultaneously acquired via an antenna and an analog-digital converter in a first measuring interval 12. The gradient field 11 causes part of the magnetization dephased by the gradient field 5 to be rephased, whereby a stimulated echo is acquired at time 13. The intensity of the stimulated echo, and therefore the first measured value, is proportional to ½ $\sin(\beta)*\sin^2(\alpha)$. With a third gradient field 14 aligned oppositely to the first and second gradient fields 5, 11, a gradient echo is acquired during the second measuring interval 15 at time 16. This gradient echo is produced by a part of the magnetization that was not flipped into the transverse plane by any of the selected excitation pulses 1, as a result of which the corresponding transverse magnetization after the common excitation pulse 8 was initially in phase, was dephased by the gradient 11, and was rephased by the gradient 14. The amplitude of the gradient echo is proportional to $\sin(\beta)*\cos^2(\alpha)$.

In step S5 it is checked whether the first and the second measured values were acquired for all the predefined phase encodings. If this is not the case, the process is repeated from step S2 onward for the remaining phase encodings. After acquisition of the first and second measured value for all the phase encodings, the first and second measured values are Fourier transformed in each case in step S6 in order to obtain a first and a second local magnetization variable. Dividing the first local magnetization variable by the second local magnetization variable cancels out the proportionality factors and the dependence on the flip angle β, so that the local flip angle α can be determined from the first and second local magnetization variable. The quotient of the first and second local magnetization variable is here ½ $\tan^2(\alpha)$. A provisional flip angle value can be calculated using this relationship in step S7.

In order to take the pulse shape, and in particular the finite length of the pulse, into account, in step S8 a correction factor dependent on the pulse shape of the selected excitation pulse 1 is determined. A typical calculation of a corresponding correction factor will be explained below with reference to FIG. 4. In step S9, the provisional flip angle value calculated in step S7 is then multiplied by the correction factor calculated in step S8 in order to obtain a corrected flip angle value. The corrected flip angle value is proportional to the local field strength of the B1 field which is used for radiation of the excitation pulses 1, 8. It can therefore be stored in the B1 field map to describe the field strength of the B1 field.

FIG. 4 shows a flowchart for calculating the correction factor. For this purpose, in step S10 the pulse shape of the selected excitation pulse 1 shown in FIG. 2 and in step S11 the pulse shape of the common excitation pulse 8 shown in FIG. 2 are predefined. The pulse shape can be predefined as a discrete-time representation of the respective pulse, in particular as a digital representation of a signal to be output via a DA converter. However, it is also possible to predefine the pulses in the form of analytical functions in each case.

In steps S12 and S13, a weighting function is determined for the excitation pulses. For this purpose a Fourier transformation is performed in order to convert the pulse representation predefined in steps S10 and S11 into a representation of the respective pulse in the frequency domain. As explained above, the representation of the respective pulse in Fourier space corresponds to an excitation profile for that pulse. As the object under examination is in a gradient field in the course of excitation, there is a direct relationship between an injected excitation frequency and the location at which resonant excitation of the nuclear spins takes place. A representation of the pulse in the frequency domain therefore directly corresponds to a representation of the excitation pattern in the spatial domain, wherein the relationship between the frequency axis and the spatial axis is predefined by the gradient field. The weighting function is specified in each case by normalizing the maximum of the frequency distribution to one.

The excitation pulses used are, for example, sinc pulses whose edge regions are smoothed by a window function. In this case the slice profiles, i.e. the Fourier transform, essentially correspond to the shape of curves 3 or 9 in FIG. 3, which represent the magnetization after radiation of the respective excitation pulse 1, 8.

Determining an excitation profile by Fourier transformation typically produces a sufficiently accurate excitation profile. If the accuracy of the method is to be improved further, instead of Fourier transformation it would be possible to use discrete-time simulation of the excitation by, for example, solving the Bloch equations for discrete-time excitation by the respective excitation pulse 1, 8 in order to obtain a spatial magnetization characteristic. Also in this case the resulting function must be normalized such that its maximum is one.

In steps S14 and S15, the assigned flip angle for the excitation pulses 1, 8 is predefined in each case and, in steps S16 and S17, multiplied by the weighting function calculated in steps S12 or S13 as the case may be. In step S16, a function is therefore provided which describes a spatial dependence of the local flip angle produced by the selected excitation pulse 1 by multiplying the flip angle assigned to the selected excitation pulse 1 by the weighting function predefined in step S12 according to the pulse shape of the selected excitation pulse 1. Accordingly, step S17 provides a function that describes the spatial characteristic of the local flip angle produced by the common excitation pulse 8.

In steps S18 and S19, predicted values are calculated for the first and second measured value. In the course of the calculation, the phase encoding carried out during the measurement can generally be disregarded. Phase encoding is generally perpendicular to the direction of the slice selection gradient. However, the determination of the correction factor only takes account of a change in the flip angle in the direction of the slice selection gradient on the basis of the pulse shape of the excitation pulse. Phase encoding therefore results only in a proportionality factor for the first and second measured value which, however, is at least approximately the same for both measured values. A corresponding proportionality factor therefore cancels out in the course of the subsequent calculation so that it is sufficient to determine the correction factor or rather the predicted values for the first and second measured value for a single phase encoding, in particular for a measurement without phase encoding gradient. In addition, in the course of the calculation other factors which can affect the first and second measured value, but which are essentially the same for both measured values and are determined by relaxation effects, for example, are disregarded. Identical proportionality factors being disregarded, the predicted values for the first and the second measured value are therefore calculated exclusively as a function of the respective transverse, i.e. lateral magnetizations present after the excitation pulses 1, 8 of the measurement sequence.

The first measured value, i.e. the received radiation intensity in the first measuring interval 12, describes the part of the magnetization which, in the measurement sequence shown in FIG. 2, was flipped by the first radiation of the excitation pulse 1 into the transverse plane where it was dephased by the gradient field 5, flipped in the longitudinal direction by the second radiation of the selected excitation pulse 1, re-flipped in the transverse direction by the common excitation pulse 8 where it was rephased by the gradient field 11. The first measured value S1 is therefore calculated as:

$$S1 = K * \frac{1}{2} \sin(\beta(z)) \sin^2(\alpha(z)) dz$$

where K is a constant which describes the initially available magnetization and other variables not taken into account in detail. As K is assumed to be the same for the first and the second measured value and, as will be explained below, the predicted value for the provisional flip angle value depends on the quotient of the predicted values for the first and the second measured value, this constant can be set equal to 1. The variables $\alpha(z)$ and $\beta(z)$ correspond to the assigned flip angles, weighted with the weighting function, of the excitation pulses 1, 8 which were calculated in steps S16 and S17.

In the measurement sequence shown in FIG. 2, the second measured value is measured in the measuring interval 15 and relates to a gradient echo provided by the gradient fields 11, 14 and whose intensity depends on the part of the magnetization that was flipped into the transverse plane neither by the first nor by the second playout of the selected excitation pulse 1. The predicted value for the second measured value is therefore calculated as $$S2 = K * \int \sin(\beta(z)) \cos^2(\alpha(z)) dz.$$

In step S20, a predicted value $\alpha'$ for the provisional flip angle value is calculated from the predicted values S1, S2 for the first and second measured values calculated in steps S18 and S19. The calculation proceeds like the calculation of the provisional flip angle value from the local magnetic variables in step S6 of FIG. 1. The predicted value is calculated as $$\alpha' = \tan^{-1}\left(\sqrt{\frac{2 * S1}{S2}}\right)$$

In step S21, the correction factor is calculated by dividing the predicted value $\alpha'$ for the provisional flip angle value by the flip angle $\alpha$ assigned to the selected excitation pulse 1, said angle having been predefined in step S14.

FIG. 5 shows another example of a method for determining a B1 field map. The method is based on the approach of first carrying out a phase-encoded measurement, then injecting the selected excitation pulse, dephasing the transverse magnetization resulting therefrom by means of a spoiler gradient, and then repeating the measurement initially carried out. The readout pulses for excitation prior to the individual phase encoding steps essentially have smaller flip angles than the selected excitation pulse. With the two separate measurements before and after the selected excitation pulse, it is possible to determine how much magnetization is "consumed" by the selected excitation pulse, and therefore the flip angle of the selected excitation pulse.

The method starts from a state of equilibrium of the object under examination in that, depending on the strength of the main magnetic field B0 of the magnetic resonance tomography scanner and the temperature, the magnetization is essentially aligned in the direction of the main magnetic field B0. In step S22, a readout pulse, i.e. an excitation pulse having a small assigned flip angle, is first radiated. Such a readout pulse has only a minimal effect on the longitudinal magnetization, but provides sufficient transverse magnetization to enable the latter to be measured. In the method shown, the measurement is carried out as a "free induction decay" measurement. Alternatively, it is possible to acquire the transverse magnetization also by spin or gradient echo measurements or similar.

In step S23 a phase gradient is activated and in step S24 an analog-digital converter is activated in order to acquire, in a measuring interval, the received radiation intensity and therefore the transverse magnetization. In step S25 it is checked whether all the phase encodings have already been carried out. If this is not the case, the procedure is repeated from step S22 onward.

In step S26 the selected excitation pulse is played out in order to flip part of the longitudinal magnetization into the transverse plane according to its assigned flip angle. Then, in step S27, a spoiler gradient is switched in order to dephase this magnetization, i.e. to change the phase such that that it is no longer measurable in immediately following measurements.

Steps S28 to S31 correspond to steps S22 to S25, i.e. the preceding measurement is repeated after playout of the selected excitation pulse.

In step S32 the results of the two measurements are transformed into the spatial domain so that, for each measured point in the spatial domain, a first measured value from the first measurement comprising steps S22 to S25 is present and a second measured value from the second measurement comprising steps S28 to S31 is present. From the first and the second measured values, a provisional flip angle value can be calculated, which describes the flip angle caused locally by the selected excitation pulse. If the effect of the readout pulses radiated in steps S22 and S28 on the longitudinal magnetization is disregarded, the quotient of the second and the first measured value is approximately equal to the cosine of the local flip angle value. This relationship enables a provisional flip angle value to be calculated for each measured point in the spatial domain. In step S33, as explained in relation to FIG. 4, a correction factor is calculated and in step S34 is multiplied by the provisional flip angle value in order to calculate a corrected flip angle value and store the latter or a value derived therefrom in a B1 field map.

The use of calculated correction factors in the exemplary embodiments explained in detail is only one example. A correction factor could also be determined by direct measurement or by comparing measurements having a high or low dependence of the determined flip angle value on the pulse shapes used.

FIG. 6 shows a magnetic resonance tomography scanner 17 having a control computer 18, at least one transmit device 19 (that includes a transmit antenna and known amplifier circuitry) and at least one reception device 20 (which includes a reception antenna and known demodulation circuitry). The transmit device 19 and the reception device 20 may share the same antenna or antenna array. The control computer 18 is designed to control the transmit device 19 and to acquire the first and second measured values via the reception device 20, and to process the first and second measured values to determine the B1 field map according to the method explained above. The control computer 18 also controls a number of gradient coils 21, 22 for producing the gradient fields.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining a B1 field map in a magnetic resonance scanner, said B1 field map describing a spatial distribution of a local field strength of a radio-frequency B1 field in the scanner, said method comprising:

operating said scanner to execute a measurement sequence that includes radiating a plurality of excitation pulses that produce said B1 field in a measurement region within said scanner, said B1 field changing a magnetization of nuclear spins in a measurement region, encompassed by said excitation region, of a subject in the scanner according to an assigned flip angle of the excitation pulses;

also in said measurement sequence, operating said scanner to acquire a first measured value, during a first measuring interval following said excitation pulses, and a second measured value in a second measuring interval following said excitation pulses, said first and second measured values resulting from said magnetization of said nuclear spins in the measurement region;

providing said first and second measurement values to a processor and, in said processor, assigning a provisional flip angle, dependent on said first and second measured values, to the flip angle assigned to a selected excitation pulse among said plurality of excitation pulses;

in said processor, calculating a correction factor dependent on a pulse shape of said selected excitation pulse, and multiplying the provisional flip angle value by said correction factor to determine a corrected flip angle value;

in said processor, using said corrected flip angle value, or a value derived therefrom, as an entry in said B1 field map describing the local field strength in the measurement region; and making the B1 field map available from the processor in electronic form as a data file.

2. A method as claimed in claim 1 comprising, in said processor, determining a predicted value for said provisional flip angle as a function of a product of said flip angle assigned to the selected excitation pulse and a weighting function that is dependent on the pulse shape of the selected excitation pulse, and calculating said correction factor as a quotient of the assigned flip angle of the selected excitation pulse and the predicted value.

3. A method as claimed in claim 1 comprising determining said weighting function in said processor by Fourier transformation of said pulse shape, or by discrete-time simulation of the excitation of the nuclear spins by the selected excitation pulse.

4. A method as claimed in claim 1 wherein said assigned flip angle is known for at least one excitation pulse among said plurality of excitation pulses, and operating said scanner to implement a preparatory measurement in which a reference flip angle value produced by said at least one excitation pulse in said measurement region is determined, and thereafter determining said correction factor as a quotient of the reference flip angle and the assigned flip angle for said at least one excitation pulse.

5. A method as claimed in claim 1 comprising, in said processor, determining a first calibrating flip angle value using a first measurement method that depends on said pulse shape of said selected excitation pulse, and calculating a second calibrating flip angle using a second measurement method that is independent of the pulse shape of any of said excitation pulses, and calculating said correction factor as a function of said first and second calibrating flip angle values.

6. A method as claimed in claim 1 comprising determining said correction factor as a function of said provisional flip angle value.

7. A method as claimed in claim 1 comprising operating said scanner in said measurement sequence to radiate said selected excitation pulse twice prior to acquiring said first and second measured values, with said assigned flip angle of the selected excitation pulse being less than 90° and, between radiations of said selected excitation pulse, activating a first gradient field that dephases said magnetization and using a common excitation pulse to acquire said first and second measured values and, in or before said first measuring interval, in or before said second measuring interval, activating a second gradient field that produces an echo of the previously dephased magnetization.

8. A method as claimed in claim 7 wherein said common excitation pulse has an assigned flip angle that is smaller than the flip angle of the selected excitation pulse.

9. A method as claimed in claim 7 comprising, with said common excitation pulse, exciting nuclear spins in a sub-region of said excitation region, said sub-region being smaller than an entirety of said excitation region.

10. A method as claimed in claim 1 comprising acquiring said first measured value before radiating said selected excitation pulse and acquiring said second measured value after radiation of said selected excitation pulse.

11. A magnetic resonance apparatus comprising:
a magnetic resonance data acquisition scanner;
a computer configured to operate said scanner to execute a measurement sequence that includes radiating a plurality of excitation pulses that produce a B1 field in a measurement region within said scanner, said B1 field changing a magnetization of nuclear spins in a measurement region, encompassed by said excitation region, of a subject in the scanner according to an assigned flip angle of the excitation pulses;
said computer being configured to operate said scanner also in said measurement sequence to acquire a first measured value, during a first measuring interval following said excitation pulses, and a second measured value in a second measuring interval following said excitation pulses, said first and second measured values resulting from said magnetization of said nuclear spins in the measurement region;
said computer being configured to assign a provisional flip angle, dependent on said first and second measured values, to the flip angle assigned to a selected excitation pulse among said plurality of excitation pulses;
said computer being configured to calculate a correction factor dependent on a pulse shape of said selected excitation pulse, and multiply the provisional flip angle value by said correction factor to determine a corrected flip angle value;
said computer being configured to use said corrected flip angle value, or a value derived therefrom, as an entry in said B1 field map describing the local field strength in the measurement region; and
said computer being configured to make the B1 field map available from the computer in electronic form as a data file.

* * * * *